United States Patent [19]

Takeuchi et al.

[11] Patent Number: 4,766,010
[45] Date of Patent: Aug. 23, 1988

[54] PROCESS FOR MANUFACTURING DIELECTRIC LAYERS FORMED FROM CERAMIC COMPOSITIONS CONTAINING INORGANIC PEROXIDE AND ELECTRONIC DEVICES INCLUDING SAID LAYERS

[75] Inventors: Yukihisa Takeuchi, Nagoya; Hideo Masumori, Anjyo, both of Japan

[73] Assignee: NGK Insulators, Ltd., Japan

[21] Appl. No.: 936,784

[22] Filed: Dec. 2, 1986

Related U.S. Application Data

[62] Division of Ser. No. 649,672, Sep. 12, 1984, Pat. No. 4,649,125.

[30] Foreign Application Priority Data

Apr. 13, 1984 [JP] Japan .................................. 59-75396

[51] Int. Cl.$^4$ .......................... B05D 5/12; C04B 35/64
[52] U.S. Cl. ........................................ 427/96; 264/60; 264/61; 264/63; 427/101; 427/102; 427/103
[58] Field of Search ................. 427/96, 101, 102, 103; 264/61, 63; 252/186.27, 186.38, 106.43

[56] References Cited

U.S. PATENT DOCUMENTS

| | | | |
|---|---|---|---|
| 3,370,966 | 2/1968 | Schwartz et al. | 501/20 |
| 3,973,975 | 8/1976 | Francel et al. | 501/76 |
| 4,336,320 | 6/1982 | Cummings et al. | 427/96 |
| 4,474,731 | 10/1984 | Brownlow | 427/96 |
| 4,481,261 | 11/1984 | Johnson et al. | 501/20 |
| 4,551,357 | 11/1985 | Takeuchi | 427/96 |
| 4,627,160 | 12/1986 | Herron | 427/96 |

*Primary Examiner*—Norman Morgenstern
*Assistant Examiner*—Margaret Burke
*Attorney, Agent, or Firm*—Parkhurst & Oliff

[57] ABSTRACT

A ceramic composition for dielectrics, consisting essentially of an inorganic dielectric material including at least one electrically insulating glass and at least one organic binder, and further comprising at least one inorganic peroxide. The inorganic peroxide serves to facilitate burnout or removal of the organic binder during firing of the ceramic composition and minimizes the content of residual carbon in the fired ceramic composition. The inorganic peroxide is preferably selected from the group consisting of calcium peroxide, strontium peroxide, barium peroxide, zinc peroxide and cadmium peroxide, and present preferably in an amount of 0.1–40% by weight. Also disclosed is a process of manufacturing a ceramic circuit board using the ceramic composition stated above.

12 Claims, No Drawings

PROCESS FOR MANUFACTURING DIELECTRIC LAYERS FORMED FROM CERAMIC COMPOSITIONS CONTAINING INORGANIC PEROXIDE AND ELECTRONIC DEVICES INCLUDING SAID LAYERS

This is a division of application Ser. No. 649,672, filed Sept. 12, 1984, now U.S. Pat. No. 4,649,125.

BACKGROUND OF THE INVENTION

The present invention relates generally to a ceramic composition designed for dielectrics, usable as dielectric ceramic pastes and green sheets for ceramic circuit boards or hybrid integrated circuits. More particularly, the invention is concerned with such a ceramic composition for dielectrics, which is suitably fired in a non-oxidizing atmosphere.

In the art of manufacture of ceramic circuit boards, especially multiple-layered ceramic circuit boards, a method has been known wherein conductor circuits are screen-printed on a ceramic green body of dielectric material, by using a conductor paste which includes, as a major component thereof, a noble metal such as gold, silver, platinum and their alloys that are stable in an oxidizing atmosphere. The ceramic green body and the printed conductor circuits of noble metal paste are then co-fired in the oxidizing atmosphere, and thus a ceramic circuit board is obtained. An alternative method is known, wherein the conductor circuit is formed of a conductor paste the major component of which is a non-noble or base metal such as copper, nickel and tungsten, and wherein a non-oxidizing atmosphere is used for firing the ceramic green body and the conductor paste.

The former method of manufacturing a ceramic circuit board is advantageous in that the co-firing process may be achieved in air. However, this method can be practiced only at a high cost because of the use of gold, silver and other noble metals that are considerably expensive. Thus, the method suffers a serious problem in terms of manufacturing economy. On the other hand, the latter method which uses base metals as a conductor is advantageous in material cost and excellent in electrical properties, but has some significant drawbacks in quality of the end products. Stated more specifically, since the firing operation in this latter method is effected in a non-oxidizing atmosphere, an organic binder which is a component of a ceramic composition for dielectrics, is not sufficiently decomposed in the non-oxidizing atmosphere, that is, the organic binder is left in the form of carbon, whereby the ceramic circuit board tends to have blackened surfaces, pin holes and blisters, and are liable to suffer insufficient sintering and deterioration of electrical properties.

As stated above, the known dielectric ceramic composition with base metal conductors has problems of low rate of burnout or removal of an organic binder, and low degree of sintering. In view of these problems, it has been considered very difficult to industrially practice the method wherein a ceramic circuit board is fabricated by way of co-firing the ceramic dielectric composition including a glass component, together with base metal conductor, in a non-oxidizing atmosphere.

Nevertheless, efforts have been made to overcome the above indicated problems associated with the technology of co-firing a dielectric ceramic composition with a conductor of non-noble or base metal. For example, various ceramic compositions for dielectrics have been proposed, including: a ceramic composition containing crystallizable glass; a ceramic composition containing a relatively large amount of alumina, zirconia or other refractory filler which is mixed with a glass component; a ceramic composition containing an oxide of high valence metal such as $Co_3O_4$; and a ceramic composition containing an organic binder which is thermally decomposable at a low temperature. However, these proposed compositions have not satisfactorily eliminated the drawbacks experienced in the prior art.

SUMMARY OF THE INVENTION

It is therefore an object of the present invention to provide an improved ceramic composition for dielectrics for ceramic circuit boards or hybrid integrated circuits, which is usable as dielectric paste for screen printing, or as a material for green sheets, and which is improved in removal of an organic binder, adhesion to a conductor, electrical properties and degree of sintering.

Another object of the invention is to provide such an improved ceramic composition which has substantially no residual carbon and exhibits excellent electrical properties even when the composition is fired in a non-oxidizing atmosphere wherein an organic binder is usually difficult to be burned out.

A further object of the invention is to provide an improved ceramic circuit board whose dielectric or insulating layers are formed of the ceramic composition referred to above, and a process of manufacturing such an improved ceramic circuit board.

According to the present invention, there is provided a ceramic composition for dielectrics, consisting essentially of an inorganic dielectric material including at least one electrically insulating glass and at least one organic binder, and at least one kind of inorganic peroxide.

The ceramic composition for dielectrics according to the invention is characterized by the inclusion of an inorganic peroxide. The presence of such an inorganic peroxide in the ceramic composition permits the organic binder contained therein, to be effectively burned out or removed when the composition is fired even in a non-oxidizing atmosphere, whereby residual carbon left in the fired composition is drastically reduced. Accordingly, the ceramic composition of the invention provides solutions to the problems experienced in the prior art, such as blackening, and developement of pin holes and blisters of the obtained ceramic circuit board, as previously pointed out. Stated differently, the ceramic composition of the invention is significantly improved in adhesion to a conductor, sinterability and electrical properties.

According to another aspect of the invention, there is provided a process of manufacturing a ceramic circuit board, which comprises the steps of: preparing a dielectric paste, from the ceramic composition described above; preparing a conductor paste which includes at least one non-noble metal or base metal and is fired to form an electrically conductive circuit; printing, with the dielectric and conductor pastes on a ceramic substrate or a ceramic green body, at least one dielectric layer in a predetermined pattern, and at least one conductor layer in a pattern of the circuit, alternately in a laminated fashion, thereby preparing an unfired printed laminate structure; and co-firing the unfired printed laminate structure in a non-oxidizing atmosphere, into the ceramic circuit board.

Another embodiment of a process of the invention of manufacturing a ceramic circuit board, comprises the steps of: preparing a plurality of green sheets of a uniform thickness from the ceramic composition referred to above; preparing a conductor paste which includes at least one base metal and is fired to form an electrically conductive circuit; printing conductor layers on the green sheets to form predetermined circuit patterns, respectively, with the conductor paste; laminating the green sheets having the printed conductor layers, to form an unfired laminated sheet structure; and co-firing the unfired laminated sheet structure in a non-oxidizing atmosphere, into the ceramic circuit board.

In accordance with a further aspect of the invention, there is provided a multiple-layered ceramic circuit board having dielectric layers, and at least one conductor layer each defining a predetermined circuit pattern, the dielectric and conductor layers being alternately superposed over each other, characterized in that the dielectric layers are formed by firing the ceramic composition referred to above.

DETAILED DESCRIPTION OF THE PREFERRED EMBODIMENTS

The inorganic peroxide used according to the invention is an inorganic peroxide or peroxy acid having an $O_2$ group of two negative charges. It is presumed that the chemical feature of the peroxide is attributed to the $O_2$ group in a molecule, and that this $O_2$ group serves to decompose and remove an organic binder in the composition under firing in a non-oxidizing atmosphere.

This inorganic peroxide is selected from peroxides of alkali metal, from peroxides of metal in group II of the periodic table, or from peroxides of heavy metal including copper peroxide, titanium peroxide, cerium peroxide and chromium peroxide. Preferably, the inorganic peroxide is selected from the group consisting of calcium peroxide, strontium peroxide, barium peroxide, zinc peroxide and cadmium peroxide. In this group, the use of calcium or strontium peroxide is particularly preferred. Further, it is preferred that such an inorganic peroxide used according to the invention may be present in the form of an oxide, glass or other compound after the composition of the invention has been fired.

The amount of an inorganic peroxide contained in the composition of the invention is suitably determined by the kind and amount of an organic binder to be used. Generally, the inorganic peroxide is added, preferably in an amount of 0.1–40% by weight of the ceramic composition. In the case the content of the inorganic peroxide is excessively low, i.e., not greater than 0.1% by weight, a sufficiently high binder-burnout capability is not rendered to the ceramic composition. On the other hand, the use of the inorganic peroxide in an amount exceeding 40% by weight will prevent the ceramic composition from forming a sufficiently dense structure, or cause similar troubles. As a rule, the inorganic peroxide is used in the form of powder, preferably of an average particle size in a range of about 0.5–10 $\mu m$, from the standpoint of degree of sintering of the composition.

It is noted that the use of an organic peroxide in place of an inorganic peroxide does not permit perfect removal of a carbon component adhering to a glass component upon firing of a dielectric ceramic composition in a non-oxidizing atmosphere. In this case, therefore, a portion of the component remains in the fired composition, causing the previously indicated inconveniences, e.g., development of blisters on the surface of a conductor which is co-fired with the ceramic composition. Although the total replacement of the inorganic peroxide by an organic peroxide is not desired for the above reason, it is possible to use such an organic peroxide in addition to an inorganic peroxide which should be added in an amount in the specified range.

The electrically insulating glass used according to the invention is preferably that which interacts with the specific inorganic peroxide indicated above, to improve the degree of sintering of the composition. More specifically, it is preferred to use: various kinds of silicate glass; silicate glass which includes at least one of $Al_2O_3$, $B_2O_3$, MgO, PbO, BaO, ZnO, $Li_2O$, $TiO_2$, CaO, $ZrO_2$, and other components; or crystallizable glass which is crystallized through heat treatment thereof. One preferred composition of such crystallizable insulating glass consists essentially of $SiO_2$, $Al_2O_3$, CaO, ZnO and $TiO_2$. Another preferred composition of the glass consists essentially of $SiO_2$, MgO, BaO, $B_2O_3$ and AnO. A further preferred composition of the glass consists essentially of $SiO_2$, $Al_2O_3$, PbO and CaO. A still further preferred composition of the glass consists essentially of $SiO_2$, $Al_2O_3$, CaO, $B_2O_3$ and MgO. A yet further preferred composition of the glass consists essentially of $SiO_2$, $B_2O_3$, PbO and CaO. In general, glasses are liable to be denatured in a reducing atmosphere. In the ceramic composition according to the present invention, however, an inorganic peroxide included in the composition serves to protect the insulating glass from denaturation. This means that the particular kind of firing atmosphere does not limit the composition of the insulating glass to be included in the ceramic composition of the invention.

As the organic binder which is a component of the ceramic composition for dielectrics of the invention, any binders commonly used in known dielectric ceramic compositions may be used. For example, the ceramic compostion of the invention may contain common binders which alternatively comprise: ethyl cellulose; polyvinyl butyral resins; polyethylene resins; polystyrene resins; polyvinyl alcohol resins; acrylic resins; methacrylic resins; or acrylate-methacrylate copolymers. Among the binders listed above, polymeric binders comprising one of the following are particularly preferred: acrylic resins; methacrylic resins; and acrylate-methacrylate copolymers. The amount of the organic binder to be included in the inorganic dielectric material is generally within a range of 0.5% to 30% by weight of the ceramic composition of the invention, preferably 3% to 20%.

The inorganic dielectric material, which includes the aforementioned insulating glass and organic binder, may further include a filler of refractory material such as alumina, zirconia, silica, mullite and cordierite, alone or in combination, and/or an additive of an oxide such as cobalt oxide, zinc oxide, praseodymium oxide and bismuth oxide, alone or in combination. The amount or amounts of the refractory filler and/or the oxide additive (are) determined so as to attain an intended degree of sintering of the ceramic composition. In normal conditions, the proportion of the insulating glass to the refractory filler and/or the oxide additive is held within a range of about 90/10 to 5/95.

As previously indicated, the ceramic composition for dielectrics of the invention having the composition which has been described, is used as dielectric ceramic pastes or green sheet materials for ceramic circuit boards or hybrid intergrated circuits. When the ceramic composition of the invention is used as a dielectric ceramic paste, a suitable vehicle such as acetone, terpineol, methyl carbitol and butyl carbitol acetate is added to the ceramic composition to prepare a paste for printing. A desired number of dielectric (insulating) and conductor layers are alternately printed, using the prepared dielectric ceramic printing paste, and a conductor paste of base metal which consists of at least one of Cu, Ni, Cr, W and Mo as its primary component(s) and the balance essentially of a glass component and an organic binder. If necessary, resistor layers are also printed with a resistor paste of $LaB_6$, with a resistor paste the primary component of which is a mixture of Ru oxides, glass and inorganic peroxide, or with a resistor paste normally used in this field. Described more specifically, at least one dielectric layer and at least one conductor layer are printed on an alumina ceramic substrate or on a green sheet of ceramic material, such that the dielectric and conductor layers are alternately laminated by printing in predetermined patterns. Each of the printed conductor layers defines a conductor circuit pattern. Thus, an unfired printed laminate structure of a ceramic circuit board is prepared. Then, the unfired printed laminate structure is co-fired in a non-oxidizing atmosphere, and thus the end product, a ceramic circuit board is fabricated. That is, the dielectric layers formed from the dielectric paste prepared from the instant ceramic composition are fired concurrently. This is contrary to the traditional method using the known dielectric printing paste, wherein the article under fabrication should be fired in a non-oxidizing atmosphere each time a layer has been printed with a base metal paste or dielectric paste according to a commonly practiced method, so called "printed lamination technology" or "thick film multilayer technology".

Obviously, the dielectric paste prepared from the instant ceramic composition of the invention may be used even in the case where a firing operation in a non-oxidizing atmosphere is carried out each time a layer has been printed with a dielectric paste and a base metal paste.

In the case where the ceramic composition of the invention is used as a material for a green sheet, a slip or slurry is prepared by adding to the ceramic composition at least one known suitable solvent such as trichloroethylene, toluene-ethyl acetate, xylene, acetone, alcohol and benzene, and if necessary, at least one known suitable plasticizer such as dibutyl phthalate, and at least one known suitable peptizer such as menhaden oil and trioleic acid glyceryl ester. Subsequently, the prepared slurry is cast into a ceramic green sheet of uniform thickness ranging from 50 to 700 μm, in a conventional doctor-blading process. A desired base metal paste is printed in a predetermined pattern to form a conductor circuit on the prepared green sheet. A desired number of the printed green sheets are stacked and laminated at an elevated temperature under a suitable pressure, whereby an unfired laminated green sheet structure is prepared. The unfired laminated sheet structure having the conductor circuit pattern layers are then co-fired in a non-oxidizing atmosphere. Thus, an intended ceramic circuit board is fabricated.

The non-oxidizing atmosphere in which the ceramic dielectric composition of the invention is suitably fired, is interpreted to mean an atmosphere which does not oxidize, to a substantial extent, the base metal conductor which is used with the instant composition, and whose major component consists of at least one of Cu, Ni, Cr, W and Mo. Generally, the firing process is achieved in a nitrogen atmosphere, in a mixture gas of nitrogen including not more than 400 ppm oxygen, in a mixture gas of nitrogen and hydrogen, or in a $H_2+N_2+H_2O$ gas (mixture of nitrogen and hydrogen gases and water vapor). It is noted that the firing atmosphere need not be held constant in nature throughout a firing process of the ceramic composition. For example, the ceramic composition of the invention may be satisfactorily fired even if the firing atmosphere varies in oxygen concentration due to variation in temperature.

It is further noted that the ceramic composition of the invention may be suitably used in the case where a multilayer ceramic structure using a known ceramic composition encounters difficulty in burnout or removal of an organic binder during a firing process even in air. In such instance, the use of the instant ceramic composition facilitates the organic binder removal and minimizes the residual carbon which is otherwise left in a larger amount within the multilayer ceramic structure.

To further illustrate the present invention, the following examples are given; however, it is to be understood that these examples should not be construed to limit the scope of the invention. Unless otherwise stated, quantities appearing in the examples are expressed as percent by weight.

EXAMPLES 1-18

Crystallizable glass comprising $SiO_2$, $Al_2O_3$, CaO, ZnO and $TiO_2$ was wet-ground to an average particle size of 5 μm, while alumina as a refractory filler was wet-ground to an average particle size of 2 μm. Calcium peroxide ($CaO_2$), as an inorganic peroxide, was dry-ground to an average particle size of 2 μm. Then, 85% of the crystallizable glass as an insulating glass, 10% of the alumina, and 5% of the calcium peroxide ($CaO_2$) were admixed with each other, and blended for two hours to give a homogeneous powder mixture of glass and ceramics.

An organic binder was added to the thus prepared glass-ceramic powder mixture in the form of an acrylic binder solution (XSA-1256 available from MITSUI TOATSU KABUSHIKI KAISHA) such that the acrylic binder was present in the glass-ceramic mixture powder in an amount of 5%. In this manner, a ceramic composition for dielectrics of the invention was obtained as Example 1.

In the same manner as used in preparing the above ceramic composition Example 1, various ceramic compositions were prepared as Examples 2-18 by admixing the above specified alumina and organic binder, and different kinds of insulating glasses and inorganic peroxides. These Examples 2-18 as well as Example 1 are specified in Table 1.

For the purpose of examining the thus obtained Examples 1-18 of Table 1 in terms of effects of the inorganic peroxides contained therein, dielectric pastes and green sheets were prepared using these Examples 1-18, according to a commonly practiced method. The dielectric pastes of Examples 1-8 were used, together with an ordinary conductor paste, to print two dielectric layers each having 50 μm thickness and three conductor layers each having 17 μm thickness (three conductor circuit patterns) on an alumina ceramic substrate, alternately in a laminated fashion, in order to produce an unfired printed laminate structure according to a known method so called "thick film multilayer technology".

TABLE 1

| Example No. | Glass Composition | Inorganic Peroxide | Proportion (%) Glass | Peroxide | Alumina | Conductor Metal |
| --- | --- | --- | --- | --- | --- | --- |
| 1 | $SiO_2$—$Al_2O_3$—CaO—ZnO—$TiO_2$ | $CaO_2$ | 85 | 5 | 10 | Cu |
| 2 | | $SrO_2$ | 85 | 5 | 10 | Cu |
| 3 | | $SrO_2$ | 80 | 0.1 | 19.9 | Ni |
| 4 | | $SrO_2$ | 75 | 20 | 5 | Cu |
| 5 | | $BaO_2$ | 60 | 1 | 39 | Ni |
| 6 | | $ZnO_2$ | 50 | 40 | 10 | Cu |
| 7 | | $CdO_2$ | 70 | 10 | 20 | Cu |
| 8 | | — | 85 | 0 | 15 | Cu |
| 9 | $SiO_2$—$Al_2O_3$—CaO—$B_2O_3$—MgO | $SrO_2$ | 39 | 1 | 60 | Ni |
| 10 | | $TiO_3 + CaO_2$ | 15 | 15 | 70 | W |
| 11 | | — | 40 | 0 | 60 | Ni |
| 12 | $SiO_2$—$Al_2O_3$—PbO—CaO | $SrO_2$ | 50 | 5 | 45 | Cu |
| 13 | | $CuO_2$ | 50 | 5 | 45 | Cu |
| 14 | | $CeO_3 + SrO_2$ | 25 | 15 | 60 | W |
| 15 | | $BaO_2 + CaO_2$ | 40 | 15 | 45 | Ni |
| 16 | | $SrO_2$ | 50 | 0.05 | 49.95 | Cu |
| 17 | | $SrO_2$ | 50 | 50 | 0 | Cu |
| 18 | | — | 5 | 0 | 95 | W |

On the other hand, each of the ceramic compositions of Examples 9-18 was used to prepare a set of five green sheets each having a 300 μm thickness. Conductor layers were printed in predetermined circuit patterns on the five green sheets of each set, so that each conductor layer has a thickness of 17 μm. These green sheets were stacked and laminated to produce an unfired laminated sheet structure. Each of the unfired printed laminate structures of Examples 1-8 and the unfired laminated sheet structures was fired in a nitrogen atmosphere containing 300 ppm of oxygen. That is, the conductor layers and the dielectric layers of each unfired structures were co-fired in the nitrogen atmosphere. Thus, the corresponding ceramic circuit boards corresponding to Examples 1-18 were obtained. These ceramic circuit boards were tested to check for the amounts of residual carbon, development of blisters and pin holes, and peeling-off or removal of the conductor layer. The results are listed in Table 2. In the fabrication of the above ceramic circuit boards, the conductor pastes used were prepared from a base metal whose primary component consists of Cu, Ni or W.

The ceramic circuit boards of Examples 1-8, 10-12, 14 and 18 were further tested for resistivity, and dielectric constant and dissipation factor at 1 MHz and 20° C. The measurements are listed in Table 3.

Further, two ceramic compositions were prepared by using the components specified in Table 4. More specifically, two different glass compositions were prepared and admixed with alumina to obtain two inorganic dielectric materials.

TABLE 2

| Example No. | Residual Carbon (%) | Blister | Pin hole | Peeling-off of Conductor |
| --- | --- | --- | --- | --- |
| 1 | <0.01 | NO | NO | NO |
| 2 | <0.01 | NO | NO | NO |
| 3 | 0.01 | NO | NO | NO |
| 4 | <0.01 | NO | NO | NO |
| 5 | <0.01 | NO | NO | NO |
| 6 | 0.02 | NO | NO | NO |
| 7 | 0.02 | NO | NO | NO |
| 8 | 0.4 | YES | YES | YES |
| 9 | <0.01 | NO | NO | NO |
| 10 | <0.01 | NO | NO | NO |
| 11 | 0.5 | YES | YES | YES |
| 12 | <0.01 | NO | NO | NO |
| 13 | 0.03 | NO | NO | NO |
| 14 | 0.08 | NO | NO | NO |
| 15 | 0.05 | NO | NO | NO |
| 16 | 0.2 | SLIGHTLY | YES | SLIGHTLY |
| 17 | <0.01 | NO | YES | SLIGHTLY |
| 18 | 0.3 | YES | YES | YES |

TABLE 3

| Example No. | Resistivity (Ω cm) | Dielectric Constant | Dissipation Factor (%) |
| --- | --- | --- | --- |
| 1 | $3 \times 10^{15}$ | 4.4 | 0.1 |
| 2 | $5 \times 10^{15}$ | 4.3 | 0.1 |
| 3 | $3 \times 10^{14}$ | 5.2 | 0.2 |
| 4 | $9 \times 10^{14}$ | 4.2 | 0.1 |
| 5 | $1 \times 10^{14}$ | 5.5 | 0.2 |
| 6 | $3 \times 10^{14}$ | 5.4 | 0.2 |
| 7 | $9 \times 10^{13}$ | 5.7 | 0.3 |
| 8 | $3 \times 10^{8}$ | 7.0 | 0.5 |
| 10 | $7 \times 10^{14}$ | 5.0 | 0.2 |
| 11 | $6 \times 10^{10}$ | 7.7 | 0.5 |
| 12 | $5 \times 10^{15}$ | 4.0 | 0.1 |
| 14 | $7 \times 10^{14}$ | 4.9 | 0.2 |
| 18 | $8 \times 10^{9}$ | 8.2 | 0.7 |

TABLE

| | Glass Composition (%) | | | | | | Alumina (%) | $SrO_2^*$ (%) | $CaO_2^*$ (%) |
| --- | --- | --- | --- | --- | --- | --- | --- | --- | --- |
| | $SiO_2$ | $Al_2O_3$ | CaO | ZnO | $TiO_2$ | SrO | | | |
| Comparative Example | 30 | 15 | 20 | 17 | 3 | 10 | 5 | 0 | 0 |
| Example of the Invention | 30 | 15 | 15 | 17 | 3 | 5 | 5 | 5 | 5 |

*$SrO_2$, $CaO_2$ - Persent of SrO, CaO after firing of the Examples

TABLE 5

| | Resistivity (Ω cm) | Dielectric Constant | Dissipation Factor (%) | Residual Carbon (%) |
| --- | --- | --- | --- | --- |
| Comparative Example | $8 \times 10^{9}$ | 7.2 | 0.6 | 0.3 |

TABLE 5-continued

| | Resistivity ($\Omega$ cm) | Dielectric Constant | Dissipation Factor (%) | Residual Carbon (%) |
|---|---|---|---|---|
| Example of the Invention | $5 \times 10^{15}$ | 4.6 | 0.1 | <0.01 |

$SrO_2$ and $CaO_2$ were added, according to the invention, to one of the two inorganic dielectric materials. No inorganic peroxide was added to the other inorganic dielectric material, which is referred to as a comparative example. The amounts of $SrO_2$ and $CaO_2$ to be added as inorganic peroxides according to the invention were determined so that the total amount of SrO (CaO) in the ceramic composition of the invention after the firing is equal to the amount of the corresponding component (SrO or CaO) of the glass composition of the comparative example. Described more specifically, the glass composition of the comparative example includes 10% of SrO while that of the instant example includes 5% of SrO. Therefore, the amount of $SrO_2$ to be added to obtain the instant example is selected so that the amount of SrO after the firing based on the addition of $SrO_2$ is 5% which is difference between the SrO contents of the glass compositions of the comparative and instant examples. The example according to the invention, and the comparative example were tested in resistivity, dielectric constant, dissipation factor and amount of residual carbon. The test results are listed in Table 5.

As is apparent from Tables 1 and 2, the ceramic compositions for dielectrics of the invention wherein at least one kind of inorganic peroxide is added to an inorganic dielectric material including an insulating glass and an organic binder, exhibit a higher degree of burnout or removal of the binder, sintering, and adhesion to a conductor of base metal, than the ceramic compositions which do not include an inorganic peroxide, even when the ceramic compositions are co-fired in a non-oxidizing atmosphere. The ceramic compositions of the invention which have been fired, have reduced number and size of blisters and pin holes, and a reduced amount of residual carbon. With respect to the reduction in the residual carbon, it was found that the $O_2$ group of the inorganic peroxide works to facilitate the decomposition of the organic binder, and thereby prevent a carbon content from being left sticking to the insulating glass and alumina. In other words, the $O_2$ group of the inorganic peroxide used according to the invention is found to have a greater effect of reducing or preventing the residual carbon, than the lattice oxygen of a common oxide.

Further, high sintering results of the instant ceramic compositions even in the case of firing in a non-oxidizing atomosphere, are considered to stem also from an effect of reaction between the insulating glass and the inorganic peroxide, and from an effect of the $O_2$ group of the inorganic peroxide to prevent denaturation or change in property of the insulating glass under the non-oxidizing atmosphere, as well as from the previously stated effect of the $O_2$ group to reduce the residual carbon.

It is also considered that the inorganic peroxide which has the foregoing effects serves to improve insulation resistance (resistivity), dielectric constant, dissipation factor, and other electrical properties of the fired ceramic compositions, as indicated in Table 3. That is, the ceramic composition of the invention is usable as an excellent dielectric material.

Further, as indicated in Tables 4 and 5, the example of the invention which contains $SrO_2$ and $CaO_2$ as inorganic peroxides demonstrates better electrical properties than the comparative example, which contains the same amounts of SrO and CaO as the instant example of the invention.

As described hitherto, the ceramic composition for dielectrics according to the invention is used as dielectric printing pastes or green sheets which are excellent in removal of the organic binder, and in sintering results, even if the composition is co-fired with a base metal paste in a non-oxidizing atmosphere. The dielectric pastes or green sheets based on the instant ceramic composition are fired into dielectric structures which are excellent in electrical properties. Hence, the present invention provides a ceramic composition for dielectrics, which is widely applied to the production of various hybrid integrated circuit boards, particularly ceramic circuit boards having a single or plurality of conductor layers formed of base metal.

What is claimed is:

1. A process of manufacturing an electronic circuit board, a hybrid integrated circuit, an integrated circuit package or a multilayer ceramic structure, comprising the steps of:
   preparing a dielectric paste for printing, from at least one insulating glass, at least one organic binder, at least one inorganic peroxide selected from the group consisting of peroxides of alkali metals, peroxides of group II elements of the Periodic Table and peroxides of heavy metals, and at least one material selected from the group consisting of refractory fillers and oxide additives;
   preparing a conductor paste from at least one base metal;
   printing, with said dielectric paste and conductor paste, at least one dielectric layer in a predetermined pattern, and at least one conductor layer in a pattern of said circuit, alternately in a laminated fashion, thereby preparing an unfired printed laminate structure; and
   co-firing said unfired printed laminate structure in a non-oxidizing atmosphere.

2. A process as claimed in claim 1, wherein said at least one base metal is selected from the group consisting of Cu, Ni, Cr, W and Mo.

3. A process as claimed in claim 1, wherein said unfired printed laminate structure is formed on a ceramic substrate or green sheet, by printing desired numbers of said dielectric and conductor layers alternately with said dielectric and conductor pastes.

4. A process of manufacturing an electronic circuit board, a hybrid integrated circuit, an integrated circuit package or multilayer ceramic structure, comprising the steps of:
   preparing a ceramic composition from at least one insulating glass, at least one organic binder, at least one inorganic peroxide selected from the group consisting of peroxides of alkali metals, peroxides of group II elements of the Periodic Table and peroxides of heavy metals, and at least one material selected from the group consisting of refractory fillers and oxides;
   preparing a plurality of green sheets of a uniform thickness from said ceramic composition;

preparing a conductor paste from at least one base metal;

printing, conductor layers formed from said conductor paste on said green sheets to form predetermined circuit patterns;

laminating said green sheets having said conductor layers, to form an unfired laminated sheet structure; and co-firing said unfired laminated sheet structure in a non-oxidizing atmosphere.

5. A process as claimed in claim 4, wherein said at least one base metal is selected from the group consisting of Cu, Ni, Cr, W and Mo.

6. A multiple layered electronic circuit board having at least one dielectric layer, and at least one conductor layer defining a predetermined circuit pattern, said at least one dielectric layer and said at least one conductor layer being alternately superposed over each other, wherein the improvement comprises:

said at least one dielectric layer being formed by firing a ceramic composition which consists essentially of at least one insulating glass, at least one organic binder, at least one inorganic peroxide selected from the group consisting of peroxides of alkali metals, peroxides of group II elements of the Periodic Table and peroxides of heavy metals, and at least one material selected from the group consisting of refractory fillers and oxide additives.

7. A multiple-layered electronic circuit board as claimed in claim 6, wherein said at least one conductor layer is formed by printing said predetermined circuit pattern with a conductor paste consisting essentially of at least one base metal, and subsequently firing the printed circuit pattern.

8. A multiple-layered ceramic circuit board as claimed in claim 7, wherein said at least one base metal is selected from the group consisting of Cu, Ni, Cr, W and Mo.

9. A multiple-layered electronic circuit board as claimed in claim 6, wherein said board is used as one of a hybrid integrated circuit, and an integrated circuit package.

10. A process of manufacturing an electronic circuit board, a hybrid integrated circuit board, an integrated circuit package or a multilayer ceramic structure, comprising the steps of:

preparing a dielectric paste from at least one insulating glass, at least one organic binder, and at least one inorganic peroxide selected from the group consisting of peroxides of alkali metals, peroxides of group II elements of the Periodic Table and peroxides of heavy metals;

preparing a conductor paste from at least one base metal;

printing, with said dielectric and conductor pastes, at least one dielectric layer in a predetermined pattern, and at least one conductor layer in a pattern of said circuit, alternately in a laminated fashion, thereby preparing an unfired printed laminate structure; and co-firing said unfired printed laminate structure in a non-oxidizing atmosphere.

11. A process as claimed in claim 10, wherein said at least one base metal is selected from the group consisting of Cu, Ni, Cr, W and Mo.

12. A process as claimed in claim 11, wherein said unfired printed laminate structure is formed from a material selected from the group consisting of a ceramic substrate and a green sheet, by printing desired numbers of said dielectric and conductor layers alternately with said dielectric paste and conductor paste.

* * * * *